(12) United States Patent
Park et al.

(10) Patent No.: US 9,276,086 B2
(45) Date of Patent: Mar. 1, 2016

(54) THIN FILM TRANSISTOR SUBSTRATE AND METHOD OF MANUFACTURING THE SAME

(71) Applicant: Samsung Display Co., Ltd., Yongin, Gyeonggi-Do (KR)

(72) Inventors: Sang-Ho Park, Suwon-si (KR); Su-Hyoung Kang, Bucheon-si (KR); Dong-Hwan Shim, Yongin-si (KR); Yoon-Ho Khang, Yongin-si (KR); Se-Hwan Yu, Seoul (KR); Min-Jung Lee, Seoul (KR); Yong-Su Lee, Hwaseong-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days.

(21) Appl. No.: 14/623,693

(22) Filed: Feb. 17, 2015

(65) Prior Publication Data

US 2015/0162420 A1    Jun. 11, 2015

Related U.S. Application Data

(62) Division of application No. 13/755,730, filed on Jan. 31, 2013, now Pat. No. 8,963,154.

(30) Foreign Application Priority Data

Aug. 10, 2012  (KR) .................. 10-2012-0087597

(51) Int. Cl.
  *H01L 21/00*  (2006.01)
  *H01L 29/66*  (2006.01)
  (Continued)

(52) U.S. Cl.
  CPC .... *H01L 29/66742* (2013.01); *H01L 21/28008* (2013.01); *H01L 29/66757* (2013.01); *H01L 29/786* (2013.01); *H01L 29/7869* (2013.01); *H01L 29/78633* (2013.01)

(58) Field of Classification Search
  CPC ................. H01L 29/78633; H01L 31/02164
  See application file for complete search history.

(56) References Cited

U.S. PATENT DOCUMENTS 5,605,847 A    2/1997  Zhang
6,608,658 B1 * 8/2003  Tsujimura et al. ............ 349/110
2005/0007512 A1  1/2005  Matsunaga et al.

(Continued)

FOREIGN PATENT DOCUMENTS

EP    0510368 B1    10/1992
JP    2005051223 A    2/2005

(Continued)

OTHER PUBLICATIONS

The Extended European Search Report for European Patent Application No. 13153783.9 dated Jan. 2, 2014.

(Continued)

*Primary Examiner* — Daniel Whalen
(74) *Attorney, Agent, or Firm* — Cantor Colburn LLP

(57) ABSTRACT

A thin film transistor substrate includes a base substrate, an active pattern disposed on the base substrate, a gate insulation pattern disposed on the active pattern, a gate electrode disposed on the gate insulation pattern and overlapping the channel, and a light-blocking pattern disposed between the base substrate and the active pattern and having a size greater than the active pattern. The active pattern includes a source electrode, a drain electrode, and a channel disposed between the source electrode and the drain electrode.

4 Claims, 17 Drawing Sheets

(51) Int. Cl.
*H01L 29/786* (2006.01)
*H01L 21/28* (2006.01)

(56) References Cited

U.S. PATENT DOCUMENTS

| | | |
|---|---|---|
| 2005/0275038 A1 | 12/2005 | Shih et al. |
| 2008/0087629 A1 | 4/2008 | Shimomura et al. |
| 2008/0203395 A1 | 8/2008 | Chao et al. |
| 2009/0014721 A1 | 1/2009 | Tanabe |
| 2010/0012944 A1 | 1/2010 | Cho et al. |
| 2011/0147740 A1 | 6/2011 | Jeong et al. |
| 2011/0241005 A1* | 10/2011 | Ro et al. .......................... 257/59 |
| 2012/0126237 A1 | 5/2012 | Masui |
| 2013/0256652 A1 | 10/2013 | Lee et al. |
| 2014/0061632 A1* | 3/2014 | Lee et al. .......................... 257/43 |
| 2014/0138772 A1* | 5/2014 | NA et al. .......................... 257/347 |

FOREIGN PATENT DOCUMENTS

| | | |
|---|---|---|
| JP | 4626659 | 11/2010 |
| KR | 1020120019307 A | 3/2012 |
| WO | 0143180 A1 | 6/2001 |

OTHER PUBLICATIONS

The partial European search report for European patent application No. 13153783.9 dated Aug. 29, 2013.

* cited by examiner

THIN FILM TRANSISTOR SUBSTRATE AND METHOD OF MANUFACTURING THE SAME

This application is a divisional application of U.S. application Ser. No. 13/755,730 filed Jan. 31, 2013 and issued as U.S. Pat. No. 8,963,154 on Feb. 24, 2015, which claims priority to Korean Patent Application No. 10-2012-0087597, filed on Aug. 10, 2012, and all the benefits accruing therefrom under 35 U.S.C. §119, the disclosure of which is hereby incorporated by reference herein in its entirety.

BACKGROUND

1. Field

Exemplary embodiments of the invention relate to a thin film transistor substrate and a method of manufacturing the thin film transistor. More particularly, one or more exemplary embodiment of the invention relates to a thin film transistor substrate, which is capable of reducing or effectively preventing a decrease in reliability due to an external light incident thereon, and a method of manufacturing the thin film transistor.

2. Description of the Related Art

Generally, a switching element such as a thin film transistor for driving a pixel in a display device includes a gate electrode, a source electrode, a drain electrode, and a channel layer forming a channel between the source electrode and the drain electrode. The channel layer includes a semiconductor layer including amorphous silicon, polysilicon, oxide semiconductor or the like.

The gate electrode is overlapped with the channel layer, and may be disposed above or under the channel layer.

However, electrical characteristics of the semiconductor layer including amorphous silicon, polysilicon, oxide semiconductor or the like, may be deteriorated such as by an external light. Thus, the thin film transistor may include a light-blocking layer to reduce or prevent a decrease in reliability of the switching element.

SUMMARY

One or more exemplary embodiment of the invention provides a thin film transistor substrate capable of protecting a channel layer from an external light.

One or more exemplary embodiment of the invention further provides a method of manufacturing a thin film transistor substrate.

According to an exemplary embodiment of the invention, a thin film transistor substrate includes a base substrate, an active pattern disposed on the base substrate, a gate insulation pattern disposed on the active pattern, a gate electrode disposed on the gate insulation pattern and overlapping the channel, and a light-blocking pattern disposed between the base substrate and the active pattern and having a size greater than the active pattern. The active pattern includes a source electrode, a drain electrode, and a channel disposed between the source electrode and the drain electrode.

In an exemplary embodiment, the source electrode, the drain electrode and the channel are disposed in a same layer of the thin film transistor substrate.

In an exemplary embodiment, the thin film transistor substrate further includes a gate line electrically connected to the gate electrode, and the gate electrode extends from the gate line.

In an exemplary embodiment, the light-blocking pattern includes a first portion which extends in a first direction and overlaps a portion of the gate line, a second portion which extends from the first portion in a second direction crossing the first direction and overlaps the gate electrode, and a third portion which extends from the second portion and overlaps the active pattern.

In an exemplary embodiment, the light-blocking pattern overlaps an entire of the gate electrode and an entire of the active pattern.

In an exemplary embodiment, the light-blocking pattern includes a first region which extends in a first direction and overlaps the active pattern, and a second region which extends from the first region in a second direction crossing the first direction and overlaps the gate electrode.

In an exemplary embodiment, a portion of the gate electrode is exposed from the channel, and the exposed portion of the gate electrode overlaps the light-blocking pattern.

In an exemplary embodiment, the thin film transistor substrate further includes a buffer pattern disposed between the light-blocking pattern and the active pattern, and the buffer pattern includes silicon oxide or silicon nitride.

In an exemplary embodiment, the thin film transistor substrate further includes a buffer layer disposed between the light-blocking pattern and the base substrate.

In an exemplary embodiment, the thin film transistor substrate further includes a data line electrically connected to the source electrode and a data insulation layer covering the data line, and the light-blocking pattern is disposed on the data insulation layer.

In an exemplary embodiment, the light-blocking pattern includes silicon-germanium alloy, germanium or titanium oxide.

In an exemplary embodiment, a thickness of the light-blocking pattern is about 100 angstroms to about 2,000 angstroms.

In an exemplary embodiment, the active pattern includes a metal oxide, and the metal oxides includes zinc oxide ("ZnO"), zinc tin oxide ("ZTO"), zinc indium oxide ("ZIO"), indium oxide ("InO"), titanium oxide ("TiO"), indium gallium zinc oxide ("IGZO") or indium zinc tin oxide ("IZTO").

According to another exemplary embodiment of the invention, a thin film transistor substrate includes a base substrate, an active pattern disposed on the base substrate, a gate insulation pattern disposed on the active pattern, a gate electrode disposed on the gate insulation pattern and overlapping the channel, and a light-blocking pattern disposed between the base substrate and the active pattern and including silicon-germanium alloy. The active pattern includes a source electrode, a drain electrode, and a channel disposed between the source electrode and the drain electrode.

In an exemplary embodiment, the light-blocking pattern has a multi-layered structure including a silicon-germanium alloy layer and a germanium layer.

According to an exemplary embodiment of the invention, a method of manufacturing a thin film transistor substrate is provided. In the method, a light-blocking layer is provided on a base substrate. A semiconductor layer is provided on the light-blocking layer. The semiconductor layer is patterned to form a semiconductor pattern. A gate insulation layer and a gate metal layer are provided on the semiconductor pattern. The gate metal layer is patterned to form a gate electrode. The gate insulation layer is patterned to form a gate insulation pattern. The light-blocking layer is patterned by using the gate electrode and the semiconductor pattern as a mask to form a light-blocking pattern having a size greater than the semiconductor pattern.

In an exemplary embodiment, the forming the gate insulation pattern exposes a portion of the semiconductor pattern, and the method may further include providing a plasma to the exposed portion of the semiconductor pattern to form a source electrode and a drain electrode.

In an exemplary embodiment, before the light-blocking layer is provided, a data line is formed on the base substrate, and a data insulation layer is provided to cover the data line.

In an exemplary embodiment, a buffer layer is provided on the light-blocking layer before the semiconductor layer is provided.

In an exemplary embodiment, a buffer layer is provided on the on the base substrate before the light-blocking layer is provided.

According to one or more exemplary embodiment discussed above, in a thin film transistor substrate having a top-gate structure, a light-blocking pattern may be formed by using a previously formed gate electrode and semiconductor pattern as a mask. Thus, the light-blocking pattern may be formed without an additional mask and without decreasing an opening ratio of a display device having the thin film transistor substrate. Furthermore, the light-blocking pattern may have an increased size so that deterioration of a thin film transistor of the thin film transistor substrate due to a leakage light may be effectively prevented or reduced.

Furthermore, the light-blocking pattern may include silicon-germanium alloy so that reliability of a thin film transistor may be increased.

BRIEF DESCRIPTION OF THE DRAWINGS

Exemplary embodiments of the invention can be understood in more detail from the following detailed description when taken in conjunction with the accompanying drawings, in which.

DETAILED DESCRIPTION

Figure 1:
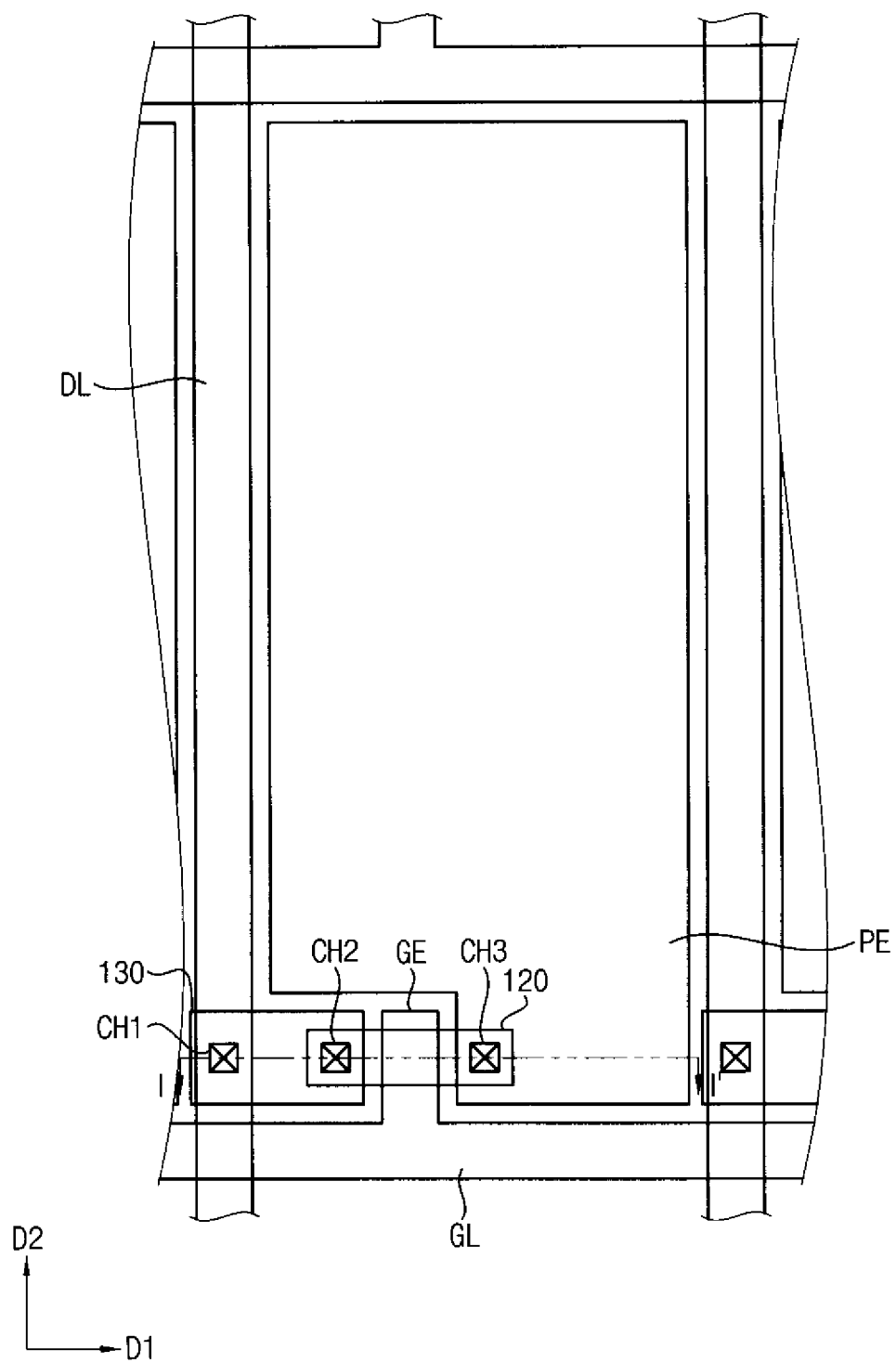
FIG. 1 is a plan view illustrating an exemplary embodiment of a thin film transistor substrate according to the invention.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on" or "connected to" another element or layer, the element or layer can be directly on or connected to another element or layer or intervening elements or layers. In contrast, when an element is referred to as being "directly on" or "directly connected to" another element or layer, there are no intervening elements or layers present. As used herein, connected may refer to elements being physically and/or electrically connected to each other. Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "below," "lower," "under," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" or "under" relative to other elements or features would then be oriented "above" relative to the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, exemplary embodiments of the invention will be explained in detail with reference to the accompanying drawings.

Figure 2:
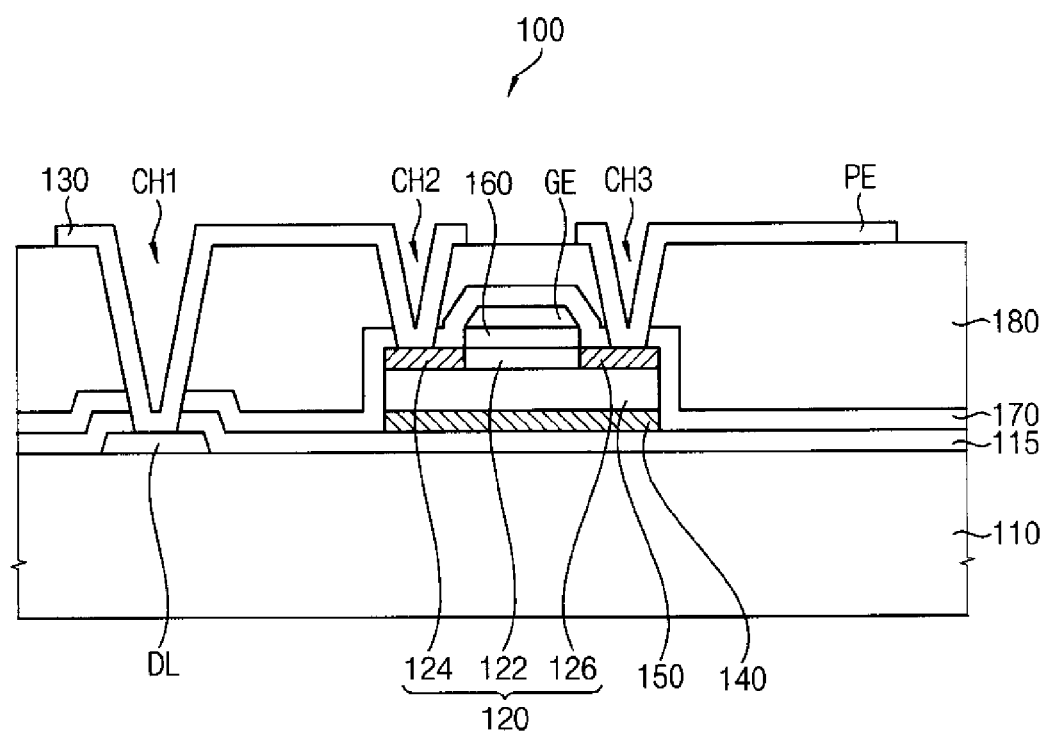
FIG. 2 is a cross-sectional view taken along line I-I' of FIG. 1.

FIG. 1 is a plan view illustrating an exemplary embodiment of a thin film transistor substrate according to the invention. FIG. 2 is a cross-sectional view taken along line I-I' of FIG. 1.

Referring to FIGS. 1 and 2, a thin film transistor substrate 100 includes a base substrate 110, a gate line GL, a data line DL, an active pattern 120 and a light-blocking pattern 140.

The gate line GL has a longitudinal axis which extends in a first direction D1 in a plan view, and the data line DL has a longitudinal axis which extends in a second direction D2 crossing the first direction D1. In one exemplary embodiment, for example, the first direction D1 may be substantially perpendicular to the second direction D2, but is not limited thereto or thereby.

The gate line GL is electrically connected to a gate electrode GE. In one exemplary embodiment, for example, the gate electrode GE may be continuous with and protrude from the gate line GL in the second direction D2.

The active pattern 120 includes a channel 122, a source electrode 124 and a drain electrode 126 spaced apart from the source electrode 124. In an exemplary embodiment, the channel 122, the source electrode 124 and the drain electrode 126 are formed from a same material layer to be continuously disposed in a same layer of the thin film transistor substrate 100. The channel 122 is disposed between the source electrode 124 and the drain electrode 126.

The channel 122 overlaps the gate electrode GE. Particularly, the gate electrode GE is disposed on the channel 122 such that the channel 122 is between the gate electrode GE and the base substrate 110. A gate insulation pattern 160 is disposed between the gate electrode GE and the channel 122. The gate electrode GE may overlap an entire of the channel 122, but is not limited thereto or thereby.

In an exemplary embodiment, a size of the gate electrode GE may be equal to or larger than a size of the channel 122 in a plan view. When the size of the gate electrode GE is larger than the size of the channel 122, a portion of the gate electrode GE which does not overlap with the channel 122, may protrude in the second direction D2 from the channel 122 or may protrude in a direction opposite to the second direction D2 from the channel 122. In one exemplary embodiment, for example, an upper portion or a lower portion of the gate electrode GE with respect to the second direction D2 may not overlap with the channel 122 as illustrated in FIG. 1.

In an exemplary embodiment, the thin film transistor substrate 100 further includes a pixel electrode PE electrically connected to the drain electrode 126.

The data line DL is on the base substrate 110, and is electrically connected to the source electrode 124. In one exemplary embodiment, for example, the data line DL may be electrically connected to the source electrode 124 through a connection electrode 130. The thin film transistor substrate 100 may further include a data insulation layer 115 on the base substrate 110 and covering (e.g., overlapping) the data line DL.

The channel 122, the source electrode 124, the drain electrode 126 and the gate electrode GE constitutes a thin film transistor. When a gate signal is applied to the gate electrode GE through the gate line GL, the channel 122 becomes conductive. Thus, a data signal provided from the data line DL is applied to the pixel electrode PE through the connection electrode 130, the source electrode 124, the channel 122 and the drain electrode 126.

The thin film transistor substrate 100 further includes a passivation layer 170 and an organic insulation layer 180. The passivation layer 170 covers the thin film transistor and the data insulation layer 115, and the organic insulation layer 180 covers the passivation layer 170. The pixel electrode PE and the connection electrode 130 are on the organic insulation layer 180.

In an exemplary embodiment, the data line DL is directly on the base substrate 110, but is not limited thereto or thereby. Alternatively, the data line DL may be on the passivation layer 170.

The connection electrode 130 is connected to the data line DL through a first contact hole CH1 extended through thicknesses of the organic insulation layer 180, the passivation layer 170 and the data insulation layer 115, and is connected to the source electrode 124 through a second contact hole CH2 extended through thicknesses of the organic insulation layer 180 and the passivation layer 170. The pixel electrode PE is connected to the drain electrode 126 through a third contact hole CH3 extended through thicknesses of the organic insulation layer 180 and the passivation layer 170.

The light-blocking pattern 140 is disposed under the channel 122. The light-blocking pattern 140 covers a lower surface of the channel 122 to reduce or effectively prevent an external light from entering the channel 122 from below the thin film transistor substrate 100.

In an exemplary embodiment, the light-blocking pattern 140 overlaps an entire of the active pattern 120 including the channel 122, and an entire of the gate electrode GE. Thus, when a portion of the gate electrode GE does not overlap with the channel 122, the light-blocking pattern 140 overlaps the entire of the gate electrode GE as well as the entire of the channel 122. Thus, the light-blocking pattern 140 may be larger than the active pattern 120 in the plan view. In one exemplary embodiment, a buffer pattern 150 is disposed between the light-blocking pattern 140 and the active pattern 120, and the light-blocking pattern 140 is disposed on the data insulation layer 115.

Alternatively, an additional buffer layer may be between the base substrate 110 and the light-blocking pattern 140. When the additional buffer layer is between the base substrate 110 and the light-blocking pattern 140, the data line DL may be directly on the base substrate 110 or on the additional buffer layer.

FIGS. 3, 4, 6, 7, 8, 9, 12 and 13 are cross-sectional views illustrating an exemplary embodiment of a method of manufacturing the thin film transistor substrate illustrated of FIGS. 1 and 2.

Figure 3:
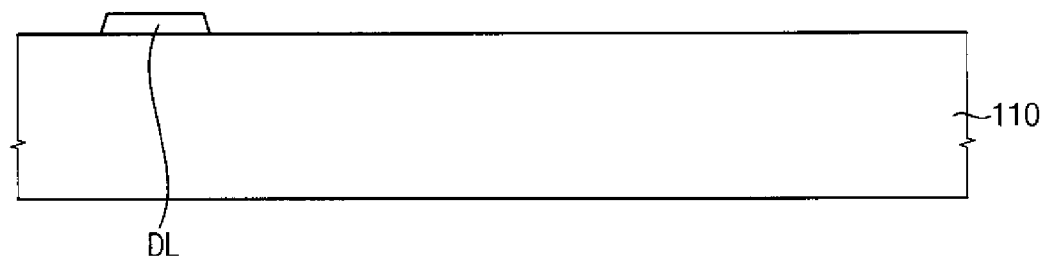
FIGS. 3, 4, 6, 7, 8, 9, 12 and 13 are cross-sectional views illustrating an exemplary embodiment of a method of manufacturing the thin film transistor substrate illustrated of FIGS. 1 and 2.

Referring to FIG. 3, a data line DL is provided, such as formed on a base substrate 110. The base substrate 110 may include a glass substrate, a quartz substrate, a silicon substrate, a plastic substrate or the like.

A data metal layer is formed on the base substrate 110 and patterned such as through a photolithography process, to form the data line DL.

The data line DL may include a material such as copper, silver, chromium, molybdenum, aluminum, titanium, manganese or an alloy thereof. The data line DL may have a single-layered structure, or a multi-layered structure including a plurality of metal layers of different materials. In one exemplary embodiment, for example, the data line DL may include a copper layer, and a titanium layer disposed above and/or under the copper layer.

Alternatively, the data line DL may include a metal layer, and an oxide layer disposed above and/or under the metal layer. In one exemplary embodiment, for example, the data line DL may include a copper layer, and an oxide layer disposed above and/or under the copper layer. The oxide layer may include at least one of indium zinc oxide ("IZO"), indium tin oxide ("ITO"), gallium zinc oxide ("GZO") or zinc aluminum oxide ("ZAO").

Figure 4:
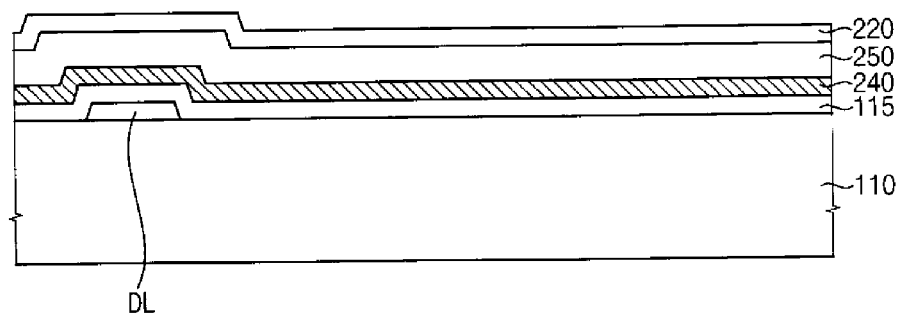

Referring to FIG. 4, a data insulation layer 115, a light-blocking layer 240, a buffer layer 250 and a semiconductor layer 220 are sequentially formed on the base substrate 110 including the data line DL thereon.

The data insulation layer 115 covers the data line DL. The data insulation layer 115 may include a material such as silicon oxide, silicon nitride or the like.

The light-blocking layer 240 is formed on the data insulation layer 115. Since the semiconductor layer 220 is exposed to an etchant in a subsequent process of etching the light-blocking layer 240, the light-blocking layer 240 may include a material having an etching selectivity with respect to the semiconductor layer 220.

The light-blocking layer 240 may include at least one of a metal, an alloy, an inorganic insulation material or an organic insulation material. In exemplary embodiments, the light-blocking layer 240 may include at least one of silicon-germanium alloy, germanium or titanium oxide. In one exemplary embodiment, the light-blocking layer 240 includes a silicon-germanium alloy (SiGe).

In an exemplary embodiment, the channel may include an oxide semiconductor. The oxide semiconductor is especially weak with respect to an ultraviolet ("UV") ray having a wavelength no more than about 450 nanometers (nm). Silicon-germanium alloy has a high UV-blocking ability. Thus, the light-blocking layer 240 including silicon-germanium alloy may efficiently block an ultraviolet ray generated by a light source or the like thereby protecting the channel.

In an exemplary embodiment, the silicon-germanium alloy of the light-blocking layer 220 may have an amorphous phase. The light-blocking layer 220 may have a single-layered structure including silicon-germanium alloy, or a multiple-layered structure including a silicon-germanium alloy layer and a germanium layer. The germanium layer may be disposed above or below the silicon-germanium alloy layer.

A thickness of the light-blocking layer 220 may be about 100 angstroms (Å) to about 2,000 Å. When the thickness of the light-blocking layer 220 is less than about 100 Å, a light-blocking ability of the light-blocking pattern 140 formed from the light-blocking layer 220 may be reduced so that electrical characteristics of the thin film transistor including the active pattern 120 are reduced. When the thickness of the light-blocking layer 220 is more than about 2,000 Å, the light-blocking pattern 140 formed from the light-blocking layer 220 may form a capacitance with the source electrode 124 or the drain electrode 126 of the active pattern 120 thereby delaying a signal.

In one exemplary embodiment, the thickness of the light-blocking layer 220 may be about 700 Å to about 2,000 Å. When the thickness of the light-blocking layer 220 is no less than about 600 Å, the light-blocking pattern may have a high optical density.

Figure 5:
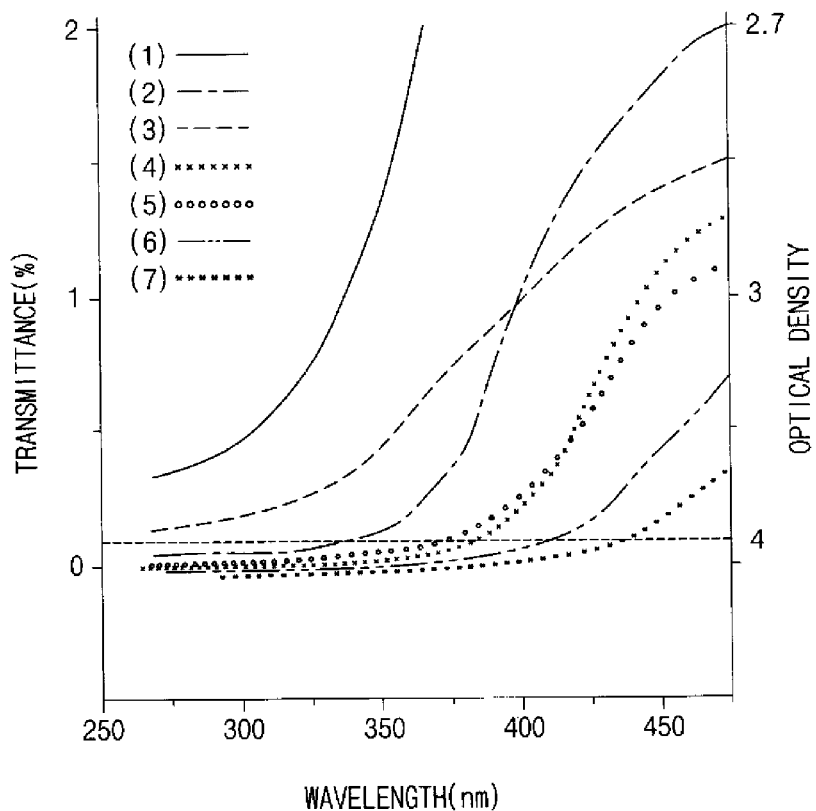
FIG. 5 is a graph illustrating a light transmittance and an optical density of a light-blocking layer including silicon-germanium alloy.

FIG. 5 is a graph illustrating a light transmittance in percent (%) and an optical density of a light-blocking layer 240 including silicon-germanium alloy. In FIG. 5, (1) represents a light-blocking layer 240 including a silicon-germanium layer having a thickness of about 300 Å, (2) represents a light-blocking layer 240 including a silicon-germanium layer having a thickness of about 100 Å and a germanium layer having a thickness of about 300 Å, (3) represents a light-blocking layer 240 including a silicon-germanium layer having a thickness of about 500 Å, (4) represents a light-blocking layer 240 including a silicon-germanium layer having a thickness of about 300 Å and a germanium layer having a thickness of about 300 Å, (5) represents a light-blocking layer 240 including a silicon-germanium layer having a thickness of about 700 Å, (6) represents a light-blocking layer 240 including a silicon-germanium layer having a thickness of about 500 Å and a germanium layer having a thickness of about 300 Å, (7) represents a light-blocking layer 240 including a silicon-germanium layer having a thickness of about 700 Å and a germanium layer having a thickness of about 300 Å.

Referring to FIG. 5, it can be noted that the light-blocking layer 240 having a double-layered structure of the silicon-germanium layer and the germanium layer has a lower light transmittance and a higher optical density than the light-blocking layer 240 having a single-layered structure of the silicon-germanium layer. Furthermore, when the thickness of the light-blocking layer 240 is no less than about 600 Å, the light-blocking layer 240 may have a light transmittance no more than about 1% with respect to a light having a wavelength no more than about 450 nm. Furthermore, when the thickness of the light-blocking layer 240 is no less than about 1,000 Å, the light-blocking layer 240 may have a light transmittance close to about 1% with respect to a light having a wavelength no more than about 450 nm, and may have an optical density no less than about 4.

Thus, it can be noted that an exemplary embodiment of the thin film transistor substrate that includes a light-blocking pattern 140 formed from the light blocking layer 240 including silicon-germanium alloy according the invention may increase reliability of a thin film transistor including the light blocking pattern 140.

The buffer layer 250 is formed on the light-blocking layer 240. In one exemplary embodiment, for example, the buffer layer 250 may include an insulation oxide such as silicon oxide, aluminum oxide, hafnium oxide, yttrium oxide or the like.

The semiconductor layer 220 is formed on the buffer layer 250. The semiconductor layer 220 may include polysilicon, an oxide semiconductor or the like. In an exemplary embodiment, the semiconductor layer 220 includes an oxide semiconductor.

The oxide semiconductor may include a metal oxide semiconductor, but is not limited thereto or thereby. In one exemplary embodiment, for example, the oxide semiconductor may include zinc, indium, gallium, tin, titanium, phosphor or the like. These may be used each alone or in a combination thereof. The metal oxide semiconductor may include at least one of zinc oxide ("ZnO"), zinc tin oxide ("ZTO"), zinc indium oxide ("ZIO"), indium oxide ("InO"), titanium oxide ("TiO"), indium gallium zinc oxide ("IGZO") or indium zinc tin oxide ("IZTO").

The data insulation layer 115, the light-blocking layer 240, the buffer layer 250 and the semiconductor layer 220 may be formed through a chemical vapor deposition ("CVD") process, a plasma enhanced chemical vapor deposition ("PECVD") process, a solution coating process, a sputtering process or the like according to the materials used therefor.

Figure 6:
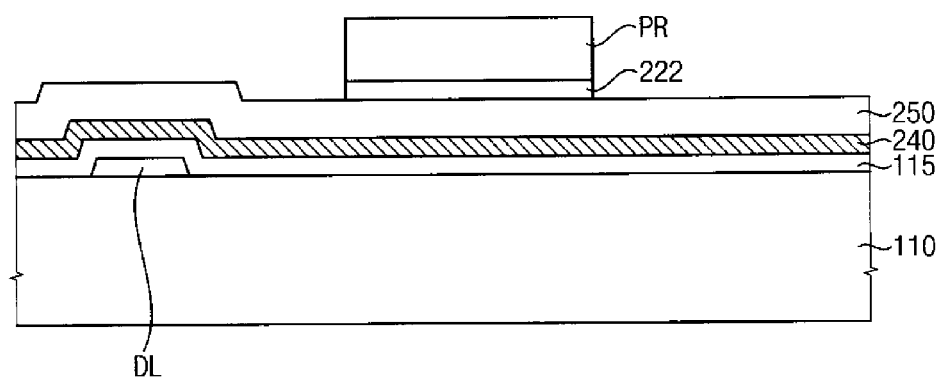

Referring to FIG. 6, the semiconductor layer 220 is patterned to form a semiconductor pattern 222. Particularly, a photoresist pattern PR is formed on the semiconductor layer 220, and the semiconductor layer 220 is etched by using the photoresist pattern PR as a mask.

Figure 7:
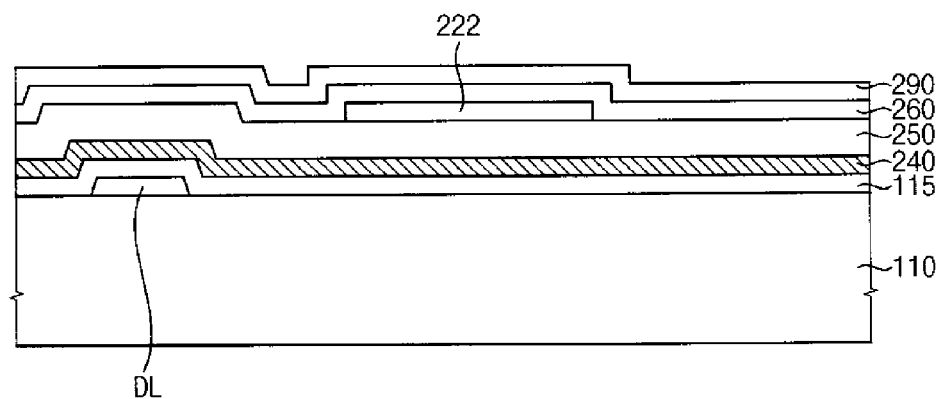

Referring to FIG. 7, a gate insulation layer 260 and a gate metal layer 290 are formed on the semiconductor pattern 222 and the buffer layer 250.

The gate insulation layer 260 covers the semiconductor pattern 222, and may include silicon oxide, silicon nitride or the like.

The gate metal layer 290 is formed on the gate insulation layer 260. The gate metal layer 290 may include copper, silver, chromium, molybdenum, aluminum, titanium, manganese or an alloy thereof. The gate metal layer 290 may have a single-layered structure, or a multiple-layered structure including a plurality of metal layers having different materials. In one exemplary embodiment, for example, the gate metal layer 290 may include a copper layer, and a titanium layer disposed above and/or under the copper layer.

Alternatively, the gate metal layer 290 may include a metal layer, and an oxide layer disposed above and/or under the metal layer. In one exemplary embodiment, for example, the gate metal layer 290 may include a copper layer, and an oxide layer disposed above and/or under the copper layer. The oxide layer may include at least one of indium zinc oxide, indium tin oxide, gallium zinc oxide or zinc aluminum oxide.

Figure 8:
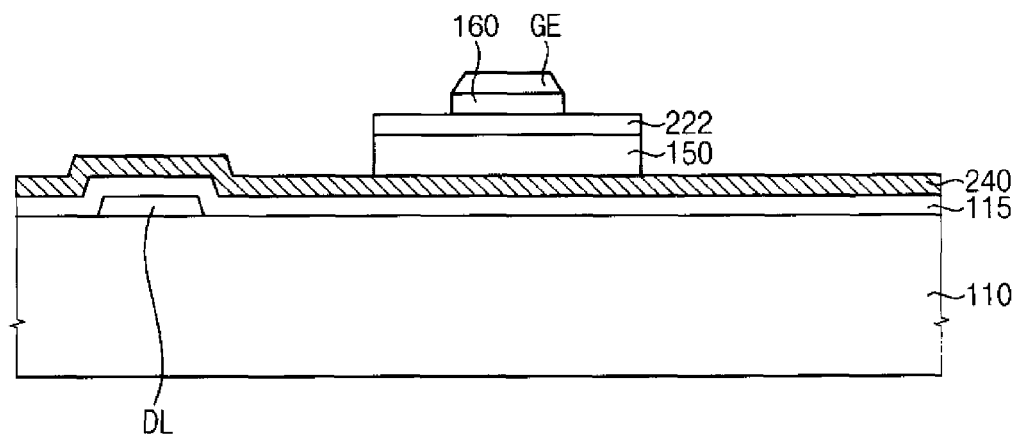

Referring to FIG. 8, the gate metal layer 290 and the gate insulation layer 260 are patterned to form a gate electrode GE, a gate line GL, and a gate insulation pattern 160, respectively.

Particularly, the gate metal layer 290 is patterned to form the gate electrode GE and the gate line GL. Thereafter, the gate insulation layer 260 is patterned by using the gate electrode GE and the gate line GL as a mask to form the gate insulation pattern 160. Thus, the gate insulation pattern 160 has a substantially same shape as the gate electrode GE and the gate line GL in a plan view.

A portion of the semiconductor pattern 222 is exposed in the process of patterning the gate insulation layer 260 to form the gate insulation pattern 160. However, since the gate insulation layer 260 includes a material different from that of the semiconductor pattern 222, the gate insulation layer 260 has an etching selectivity with respect to the semiconductor pattern 222. Thus, the semiconductor pattern 222 is not etched.

In an exemplary embodiment, the gate insulation layer 260 may include a material similar to the buffer layer 250. Thus, the buffer layer 250 may be etched in the process of etching the gate insulation layer 260 to form the gate insulation pattern 160. Thus, the light-blocking layer 240 disposed under the buffer layer 250 is exposed by the etching of the buffer layer 250, and a portion of the buffer layer 250 which is disposed under the semiconductor pattern 250 remains to form a buffer pattern 150.

Figure 9:
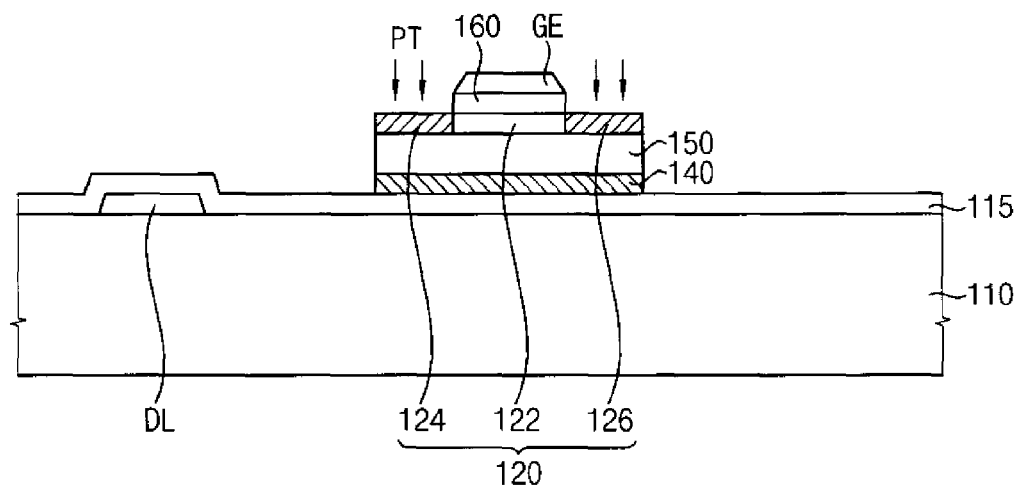

Referring to FIG. 9, the light-blocking layer 240 is etched by using the gate electrode 160 and the semiconductor pattern 222 as a mask to form a light-blocking pattern 140. Thus, the data insulation layer 115 is exposed by the etching of the light-blocking layer 240.

Figure 10:
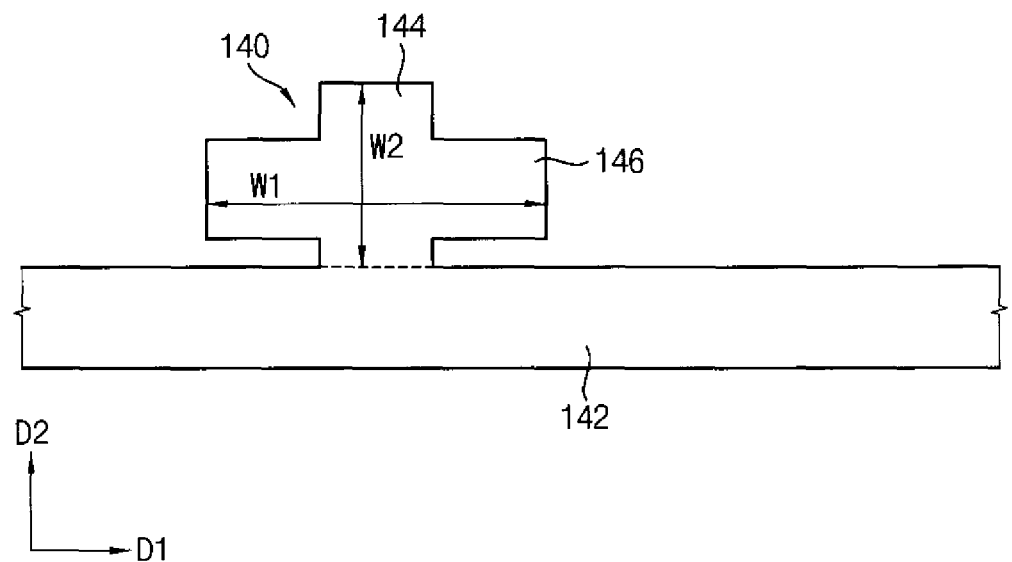
FIGS. 10 and 11 are plan views illustrating exemplary embodiments of a light-blocking pattern of a thin film transistor substrate according to the invention.

FIG. 10 is a plan view illustrating an exemplary embodiment of a light-blocking pattern of a thin film transistor substrate according to the invention.

Referring to FIG. 10, the light-blocking pattern 140 includes a first portion 142 which overlaps a portion of the gate line GL, a second portion 144 which continuously extends from the first portion 142 and overlaps the gate electrode GE, and a third portion 146 which continuously extends from the second portion 144 and overlaps the semiconductor pattern 222. The first, second and third portions 142, 144 and 146 may collectively form a single, unitary indivisible light-blocking pattern 140.

In the illustrated exemplary embodiment, for example, the first portion 142 has a longitudinal axis which extends in the first direction D1, the second portion 144 has a longitudinal axis which extends in the second direction D2, and the third portion 146 has a longitudinal axis which extends in the first direction D1. In the plan view, an edge of the second portion 144 substantially coincides with an edge of the gate electrode GE, and an edge of the third portion 146 substantially coincides with an edge of the semiconductor pattern 222. Thus, a width W1 of the portion of the light-blocking pattern 140 which overlaps the semiconductor pattern 222 in the first direction D1 is substantially the same as a width of the semiconductor pattern 222 in the first direction D1. Furthermore, a width W2 of the portion of the light-blocking pattern 140 which overlaps the gate electrode GE in the second direction D2 is substantially the same as a width of the gate electrode GE in the second direction D2.

As illustrated in FIG. 10, the light-blocking pattern 140 may overlap with an entire of the gate line GL including the gate electrode GE. Alternatively, the light-blocking pattern 140 may overlap a portion of the gate line GL which is adjacent to the gate electrode GE, that is, less than an entire of the gate line GL. Since the gate line GL is formed from a metal layer, the gate line GL has a high reflectivity. Thus, when a light incident on a lower surface of the gate line GL is reflected to enter the channel 122, electrical characteristics of the thin film transistor may be deteriorated. In an exemplary embodiment, the light-blocking pattern 140 overlaps a portion of the reflecting gate line GL to block the incident light, thereby improving a reliability of the thin film transistor.

The buffer pattern 150 has a substantially same shape as the light-blocking pattern 140 in a plan view.

In an exemplary embodiment, the portions of the light-blocking pattern 140 overlapping an entire of the semiconductor pattern 222 and the gate electrode GE form a cross shape in the plan view. However, the shape of the portions of the light-blocking pattern 140 may be changed depending on a shape and/or disposition of the semiconductor pattern 222 and the gate electrode GE. In one exemplary embodiment, for example, the light-blocking pattern 140 may have a T-shape, a quadrangular shape, a rectangular shape or the like.

Figure 11:
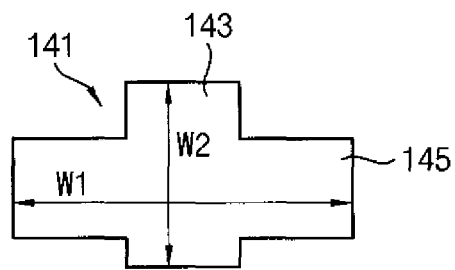
Figure 11:
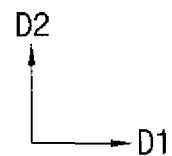

Alternatively, a light-blocking pattern 140 may not overlap with the gate line GL, and may overlap with the gate electrode GE and the semiconductor pattern 222. That is, the gate line GL may be exposed by the light-blocking pattern 140. Referring to FIG. 11, a light-blocking pattern 141 includes a first portion 143 which overlaps the gate electrode GE, and a second portion 145 which continuously extends from the first portion 143 in the first direction D1 and overlaps the semiconductor pattern 222. The first and second portions 143 and 145 may collectively form a single, unitary indivisible light-blocking pattern 141.

Thus, in the plan view, an edge of the first portion 143 substantially coincides with an edge of the gate electrode GE, and an edge of the second portion 145 substantially coincides with an edge of the semiconductor pattern 222. Thus, a width W1 of a portion of the light-blocking pattern 141 which overlaps the semiconductor pattern 222 in the first direction D1 is substantially the same as a width of a portion of the semiconductor pattern 222 in the first direction D1. Furthermore, a width W2 of a portion of the light-blocking pattern 141 which overlaps the gate electrode GE in the second direction D2 is substantially the same as a width of the gate electrode GE in the second direction D2.

When an individual mask is used for forming the light-blocking pattern 140, manufacturing costs for a thin film transistor substrate may be undesirably increased, and an opening ratio of a display device having the thin film transistor substrate may be undesirably reduced. In one or more exemplary embodiment of the invention, the light-blocking layer 240 is patterned by using the existing gate electrode GE, gate line GL and semiconductor pattern 222 as a mask. Thus, the light-blocking pattern 140 may be formed from the light-blocking layer 240 without an additional mask, such that an opening ratio of a display device having a thin film transistor substrate with the light-blocking pattern 140 is not substantially reduced. Furthermore, since the light-blocking pattern 140 has a size equal to or greater than the semiconductor pattern 222, a light-blocking ability of the thin film transistor substrate may be increased.

Referring again to FIG. 9, a channel 122, a source electrode 124 and a drain electrode 126 are formed from the semiconductor pattern 222. Particularly, a portion of the semiconductor pattern 222 which exposed by the gate electrode GE and the gate insulation pattern 160, is changed to the source electrode 124 and the drain electrode 126.

In exemplary embodiments, for example, the semiconductor pattern 222 may be plasma-treated to form the source electrode 124 and the drain electrode 126. In one exemplary embodiment, for example, an exposed portion of the semiconductor pattern 222 may be provided with a plasma gas PT indicated by the downward arrows in FIG. 9, of $H_2$, He, $PH_3$, $NH_3$, $SiH_4$, $CH_4$, $C_2H_2$, $B_2H_6$, $CO_2$, $GeH_4$, $H_2Se$, $H_2S$, Ar, $N_2$, $N_2O$, $CHF_3$ or the like. Accordingly, at least a portion of a semiconductor material included in the semiconductor pattern 222 is reduced to form a metallic conductor. As a result, the reduced portion of the semiconductor pattern 222 forms the source electrode 124 and the drain electrode 126, and a portion of the semiconductor pattern 222 which is covered by the gate electrode GE and the gate insulation pattern 160, remains to function as the channel 122.

Alternatively, the semiconductor pattern 222 may be heated in an atmosphere of a reducing gas or may be ion-implanted to form the source electrode 124 and the drain electrode 126.

In the illustrated exemplary embodiment, the source electrode 124 and the drain electrode 126 are formed after the light-blocking layer 240 is patterned. Alternatively, the source electrode 124 and the drain electrode 126 may be formed before the light-blocking layer 240 is patterned.

Figure 12:
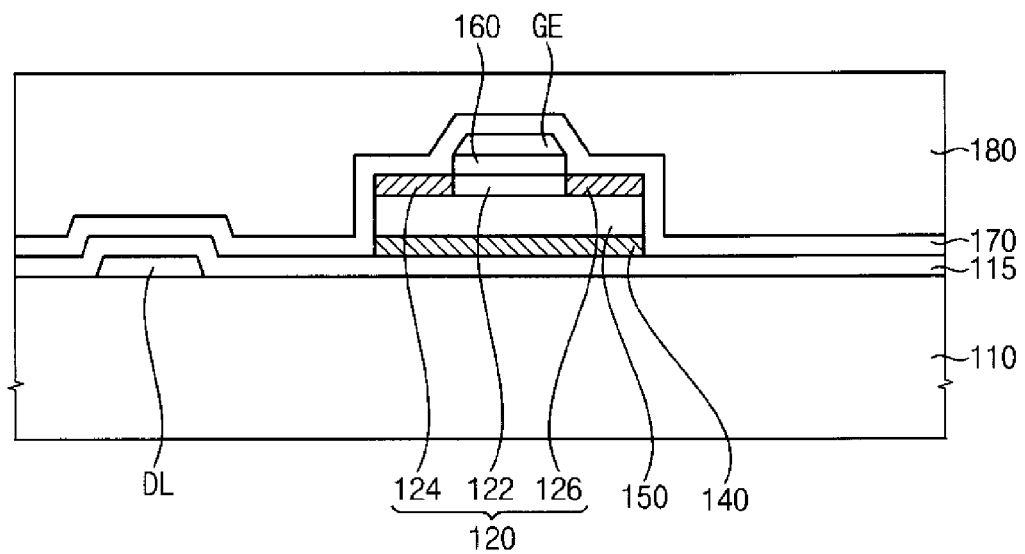

Referring to FIG. 12, a passivation layer 170 is formed to cover the gate electrode GE, the source electrode 124, the drain electrode 126 and the data insulation layer 115, and an organic insulation layer 180 is formed on the passivation layer 170.

The passivation layer 170 may include silicon oxide, silicon nitride or the like. The organic insulation layer 180 planarizes a surface of the thin film transistor substrate. In an exemplary embodiment, a photoresist composition may be coated on the passivation layer 170 to form the organic insulation layer 180.

Figure 13:
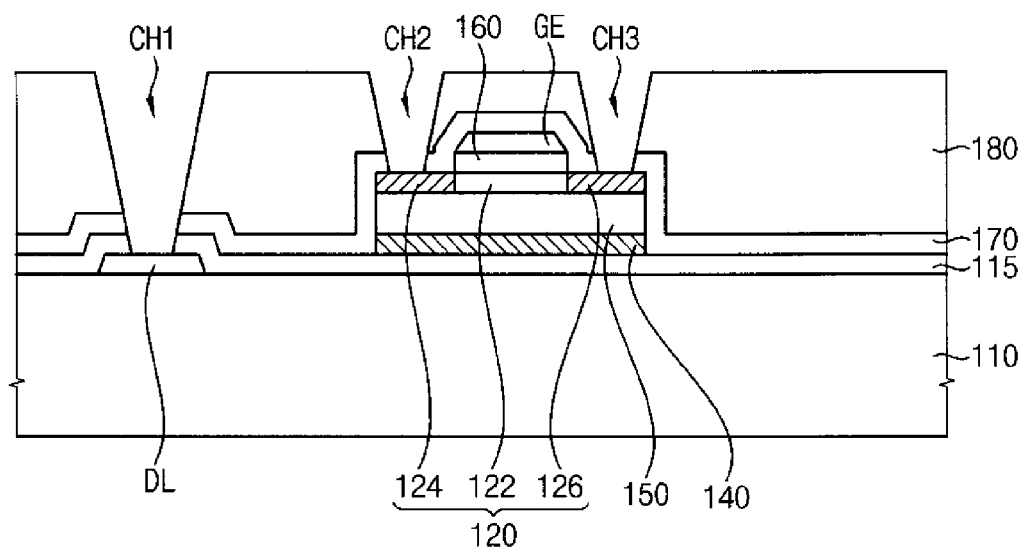

Referring to FIG. 13, the data insulation layer 115, the passivation layer 170 and the organic insulation layer 180 are patterned to form contact holes.

In one exemplary embodiment, for example, the data insulation layer 115, the passivation layer 170 and the organic insulation layer 180 are patterned to form a first contact hole CH1 exposing the data line DL. The passivation layer 170 and the organic insulation layer 180 are patterned to form a second contact hole CH2 exposing the source electrode 124 and a third hole CH3 exposing the drain electrode 126.

In one exemplary embodiment of forming the contact holes CH1, CH2 and CH3, for example, the organic insulation layer 180 is exposed to a light. Thereafter, a developing solution is provided to the organic insulation layer 180 to remove an exposed portion or a non-exposed portion, thereby patterning the organic insulation layer 180. The passivation layer 170 and the data insulation layer 115 are etched by using the patterned organic insulation layer 180 as a mask to form the first to third contact holes CH1, CH2 and CH3.

Thereafter, a transparent conductive layer is formed on the patterned organic insulation layer 180. The transparent conductive layer may include indium zinc oxide, indium tin oxide or the like.

The transparent conductive layer is pattered to form the connection electrode 130 and the pixel electrode PE, which are illustrated in FIG. 2. The connection electrode 130 contacts the data line DL through the first contact hole CH1, and contacts the source electrode 124 through the second contact hole CH2. The pixel electrode PE contacts the drain electrode 126 through the third contact hole CH3.

In an exemplary embodiment, the gate electrode GE of a thin film transistor is formed after forming the semiconductor pattern 222, and the light-blocking pattern 140 is formed by using the semiconductor pattern 222 and the gate electrode GE as a mask. Thus, the light-blocking pattern 140 may be formed without substantial decrease of an opening ratio of a display device having a thin film transistor substrate including the thin film transistor. Furthermore, since the light-blocking pattern 140 has a size greater than the semiconductor pattern 222, leaking light incident to the channel 122 of the thin film transistor may be reduced or effectively prevented.

One or more exemplary embodiment of a thin film transistor substrate according to the invention may be used for an array substrate of a liquid crystal display device, but is not limited thereto. In an alternative exemplary embodiment, for example, the thin film transistor substrate may be used for another display device such as an organic electroluminescent ("EL") display device, a circuit substrate having a thin film transistor, a semiconductor device or the like. It is readily apparent to those of reasonable skill in the art that various modifications may be made without departing from the spirit and scope of the invention which is defined by the metes and bounds of the appended claims.

Figure 14:
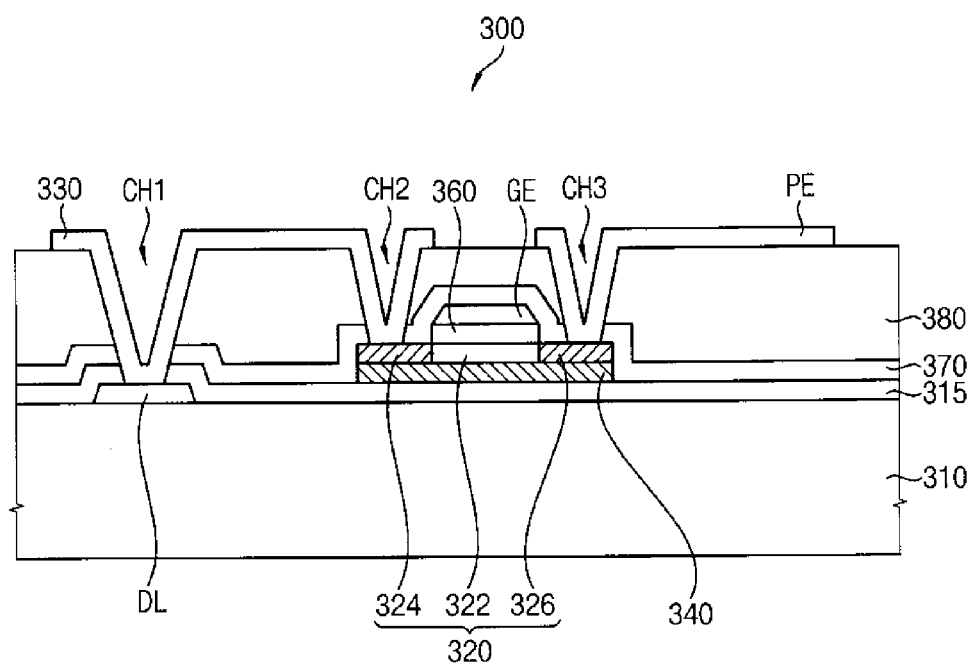
FIG. 14 is a cross-sectional view illustrating another exemplary embodiment of a thin film transistor substrate according to the invention.
Figure 15:
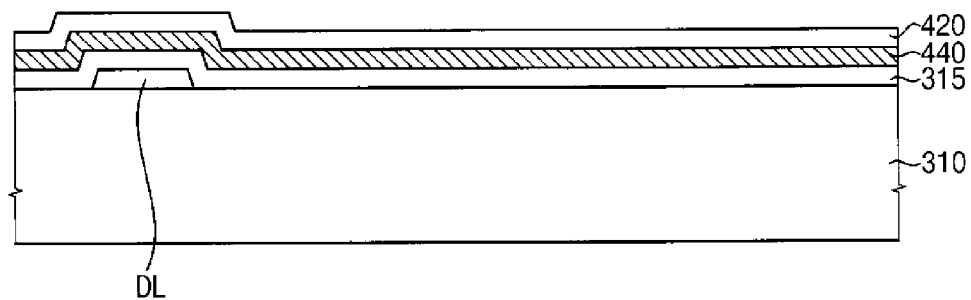
FIGS. 15 to 19 are cross-sectional views illustrating an exemplary embodiment of a method of manufacturing the thin film transistor substrate illustrated of FIG. 14.

FIG. 14 is a cross-sectional view illustrating another exemplary embodiment of a thin film transistor substrate according to the invention. Particularly, FIG. 14 illustrates a cross-sectional view substantially the same as that of FIG. 2, such as along line I-I' of FIG. 1.

Referring to FIG. 14, a thin film transistor substrate 300 includes a base substrate 310, a gate line GL, a data line DL, an active pattern 320 and a light-blocking pattern 340.

The active pattern 320 includes a channel 322, a source electrode 324 and a drain electrode 326. In an exemplary embodiment, the channel 322, the source electrode 324 and the drain electrode 326 are formed from a same material layer to be continuously disposed in a same layer of the thin film transistor substrate 300. The channel 322 is disposed between the source electrode 324 and the drain electrode 326. The drain electrode 326 is electrically connected to the pixel electrode PE. A gate insulation pattern 360 is disposed between the gate electrode GE and the channel 322.

The data line DL is on the base substrate 310, and is electrically connected to the source electrode 324. A data insulation layer 315 covers the data line DL and the base substrate 310.

In an exemplary embodiment, the data line DL is directly on the base substrate 310. Alternatively, the data line DL may be on a passivation layer 370.

The passivation layer 370 covers the gate electrode GE, the active pattern 320 and the data insulation layer 315, and an organic insulation layer 380 covers the passivation layer 370. The pixel electrode PE and the connection electrode 330 are on the organic insulation layer 380. The connection electrode 330 is connected to the data line DL through a first contact hole CH1, and connected to the source electrode 324 through a second contact hole CH2. The pixel electrode PE is connected to the drain electrode 326 through a third contact hole CH3.

The light-blocking pattern 340 is disposed under the channel 322. The light-blocking pattern 340 overlaps an entire of the active pattern 320 including the channel 322, and an entire of the gate electrode GE. Thus, the light-blocking pattern 340 has a size greater than the active pattern 320 in a plan view.

In an exemplary embodiment, the thin film transistor substrate 300 does not include the buffer pattern 150 illustrated in FIG. 2. Thus, the light-blocking pattern 340 may contact the active pattern 320.

Alternatively, a buffer layer may be additionally between the base substrate 310 and the light-blocking pattern 340. When the additional buffer layer is between the base substrate 310 and the light-blocking pattern 340, the data line DL may be directly on the base substrate 310 or on the additional buffer layer.

The thin film transistor substrate 300 is substantially the same as the thin film transistor substrate 100 illustrated in FIGS. 1 and 2 except for excluding the buffer pattern 150. Thus, any duplicated explanation will be omitted.

FIGS. 15 to 19 are cross-sectional views illustrating an exemplary embodiment of a method of manufacturing the thin film transistor substrate illustrated in FIG. 14.

Referring to FIG. 14, a data line DL is provided, such as formed on the base substrate 310. In one exemplary embodiment, for example, a data metal layer is formed on the base substrate 310, and patterned through a photolithography process to form the data line DL.

Thereafter, a data insulation layer 315, a light-blocking layer 440 and a semiconductor layer 420 are sequentially formed on the base substrate 310.

Figure 16:
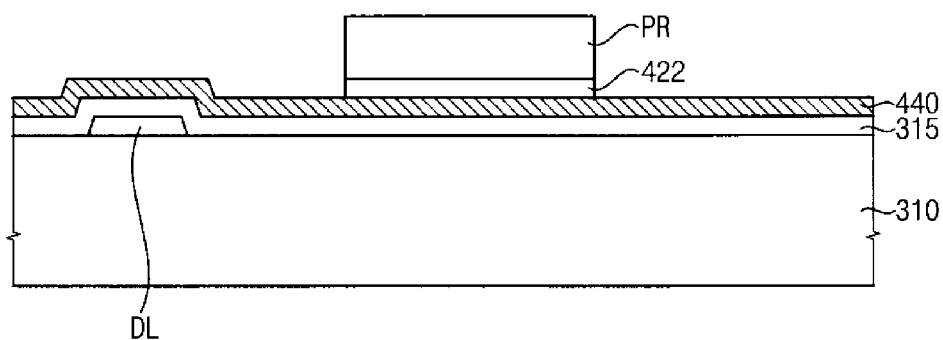

Referring to FIG. 16, the semiconductor layer 420 is patterned to form a semiconductor pattern 422. Particularly, a photoresist pattern PR is formed on the semiconductor layer 420, and the semiconductor layer 420 is etched by using the photoresist pattern PR as a mask.

Figure 17:
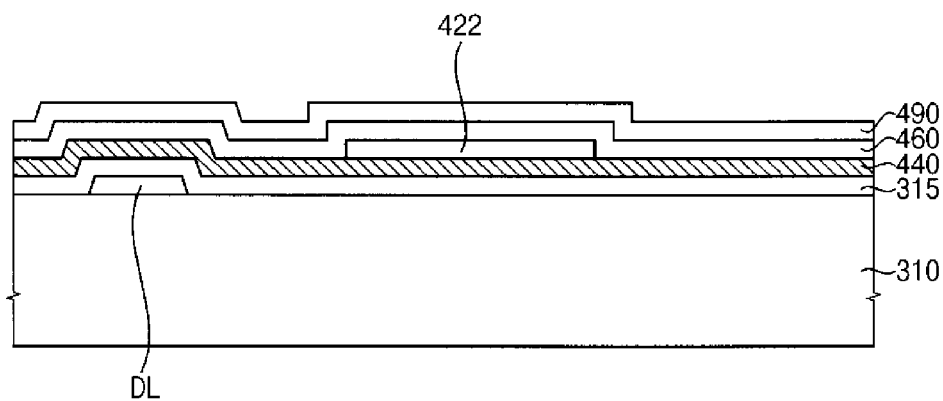

Referring to FIG. 17, a gate insulation layer 460 and a gate metal layer 490 are formed on the semiconductor pattern 422 and the light-blocking layer 440.

Figure 18:
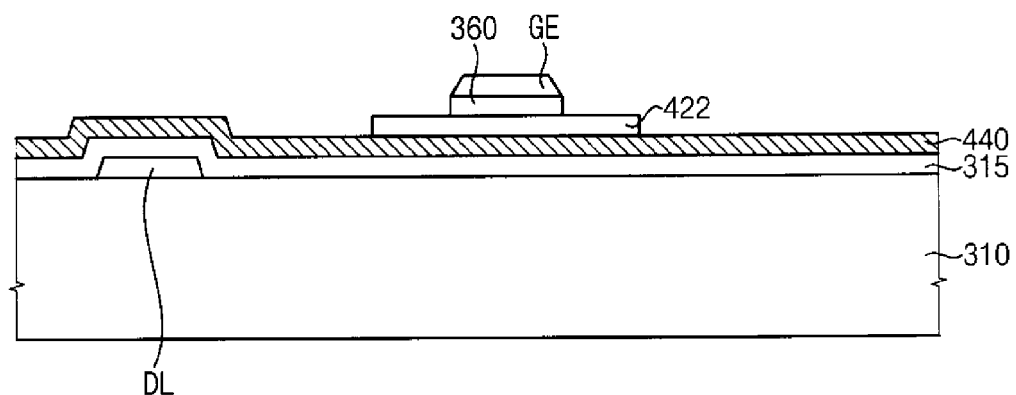

Referring to FIG. 18, the gate metal layer 490 and the gate insulation layer 460 are patterned to form a gate electrode GE, a gate line GL and a gate insulation pattern 360, respectively. Particularly, the gate metal layer 490 is patterned to form the gate electrode GE and the gate line GL. Thereafter, the gate insulation layer 460 is pattered by using the gate electrode GE and the gate line GL as a mask to form the gate insulation pattern 360. Accordingly, a portion of the semiconductor pattern 422 and the light-blocking layer 440 which were disposed under the gate insulation layer 460 are exposed by forming the gate electrode GE, the gate line GL and the gate insulation pattern 360.

Figure 19:
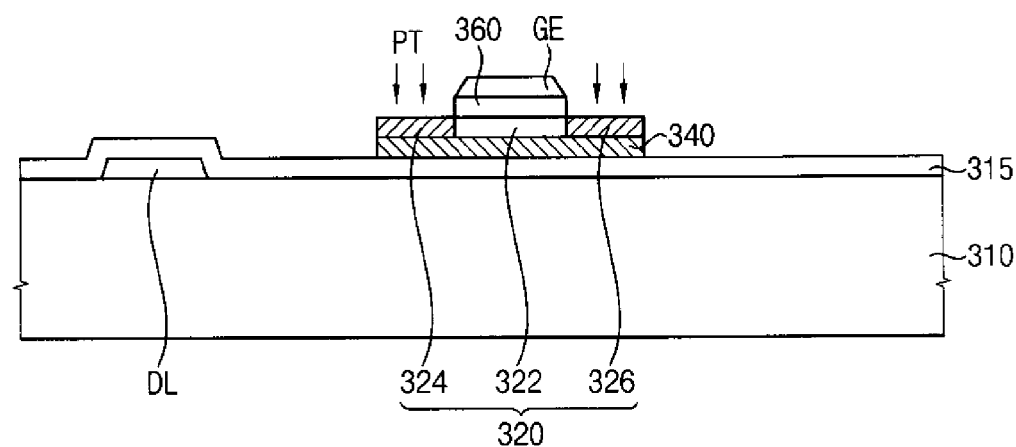

Referring to FIG. 19, the light-blocking layer 440 is etched by using the gate electrode GE and the semiconductor pattern 422 as a mask to form a light-blocking pattern 340. Thus, the light-blocking pattern 340 overlaps substantially an entire of the gate electrode GE and substantially an entire of the semiconductor pattern 422. Particularly, the light-blocking pattern 340 may have a shape substantially the same as the exemplary embodiment of the light-blocking pattern illustrated in FIG. 10.

A channel 322, a source electrode 324 and a drain electrode 326 are formed from the semiconductor pattern 422. In one exemplary embodiment, for example, a plasma gas PT or the like is provided to a portion of the semiconductor pattern 422 which is exposed by the gate electrode GE and the gate insulation pattern 360, to change the exposed portion of the semiconductor pattern 422 to the source electrode 324 and the drain electrode 326. A portion of the semiconductor pattern 422 which is covered by the gate electrode GE and the gate insulation pattern 360, forms the channel 322.

The process of providing a plasma gas PT to the semiconductor pattern 422 may be performed after or before the light-blocking layer 440 is patterned.

Thereafter, with reference to FIG. 14 the data insulation layer 315, the passivation layer 370 and the organic insulation layer 380 are patterned to form contact holes CH1, CH2 and CH3. Thereafter, a transparent conductive layer is formed on the organic insulation layer 380 and pattered to form the connection electrode 330 and the pixel electrode PE illustrated in FIG. 14.

Figure 20:
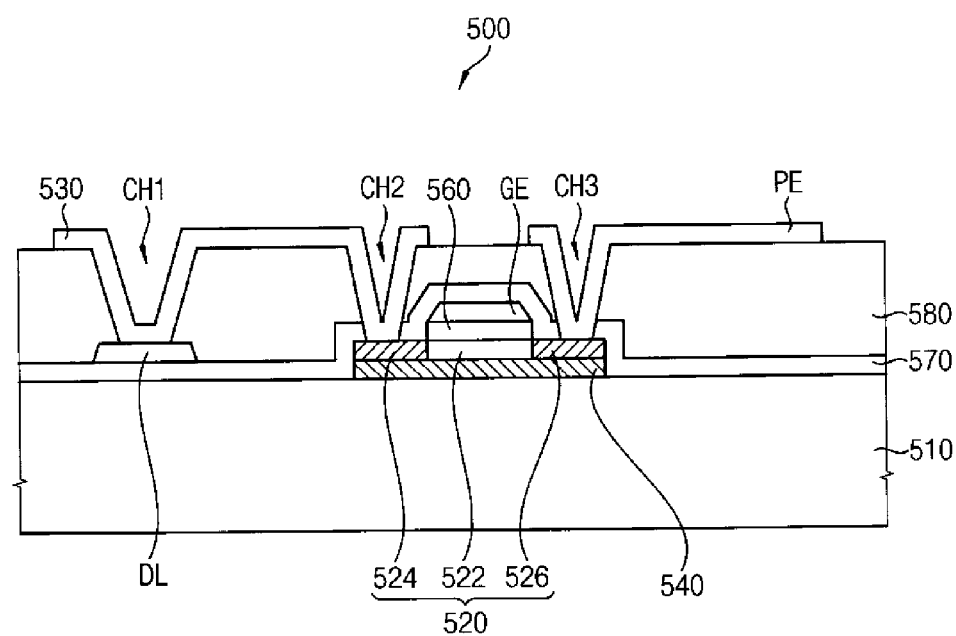
FIG. 20 is a cross-sectional view illustrating still another exemplary embodiment of a thin film transistor substrate according to the invention.

FIG. 20 is a cross-sectional view illustrating still another exemplary embodiment of a thin film transistor substrate according to the invention. Particularly, FIG. 20 illustrates a cross-sectional view substantially the same as that of FIG. 2, such as along line I-I' of FIG. 1.

Referring to FIG. 20, a thin film transistor substrate 500 includes a base substrate 510, a gate line GL, a data line DL, an active pattern 520 and a light-blocking pattern 540.

The active pattern 520 includes a channel 522, a source electrode 524 and a drain electrode 526. The channel 522, the source electrode 524 and the drain electrode 526 are formed from a same layer to be continuously disposed in a same layer of the thin film transistor substrate 500. The channel 522 is disposed between the source electrode 524 and the drain electrode 526. The drain electrode 526 is electrically connected to the pixel electrode PE. A gate insulation pattern 560 is disposed between the gate electrode GE and the channel 522.

A passivation layer 570 covers the gate electrode GE, the active pattern 520 and the base substrate 510, and an organic insulation layer 580 covers the passivation layer 570. The pixel electrode PE and a connection electrode 530 are on the organic insulation layer 580. The connection electrode 530 is connected to the data line DL through a first contact hole CH1, and connected to the source electrode 524 through a second contact hole CH2. The pixel electrode PE is connected to the drain electrode 526 through a third contact hole CH3.

The data line DL is on the passivation layer 570, and is electrically connected to the source electrode 524 via the connection electrode 530.

The light-blocking pattern 540 is disposed under the channel 522. The light-blocking pattern 540 overlaps an entire of the active pattern 520 including the channel 522 and a portion of the gate electrode GE, which does not overlap with the active pattern 520. Thus, the light-blocking pattern 540 has a size greater than the active pattern 520 in a plan view.

In an exemplary embodiment, the thin film transistor substrate 500 does not include the buffer pattern 150 and the data insulation layer 115 illustrated in FIG. 2. Thus, the light-blocking pattern 540 may contact the base substrate 510.

The thin film transistor substrate 500 is substantially the same as the thin film transistor substrate 100 illustrated in FIGS. 1 and 2 except for excluding the buffer pattern 150 and the data insulation layer 115, and except for the data line DL on the base substrate 110. Thus, any duplicated explanation will be omitted.

FIGS. 21 to 26 are cross-sectional views illustrating an exemplary embodiment of a method of manufacturing the thin film transistor substrate illustrated in FIG. 20.

Figure 21:
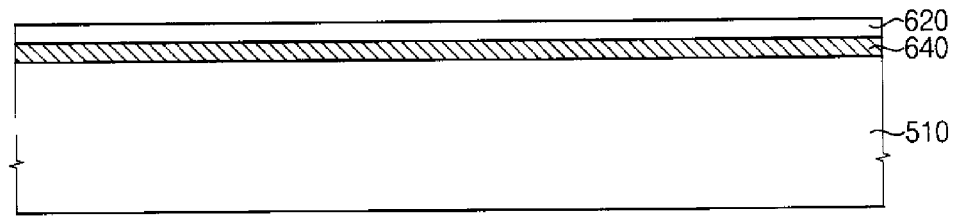
FIGS. 21 to 26 are cross-sectional views illustrating an exemplary embodiment of a method of manufacturing the thin film transistor substrate illustrated of FIG. 20.

Referring to FIG. 21, a light-blocking layer 640 and a semiconductor layer 620 are sequentially formed on the base substrate 510.

Figure 22:
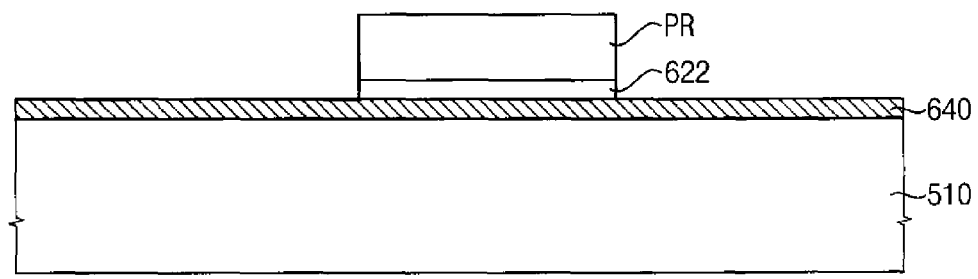

Referring to FIG. 22, the semiconductor layer 620 is patterned to form a semiconductor pattern 622. In one exemplary embodiment, for example, a photoresist pattern PR is formed on the semiconductor layer 620, and the semiconductor layer 620 is etched by using the photoresist pattern PR as a mask.

Figure 23:
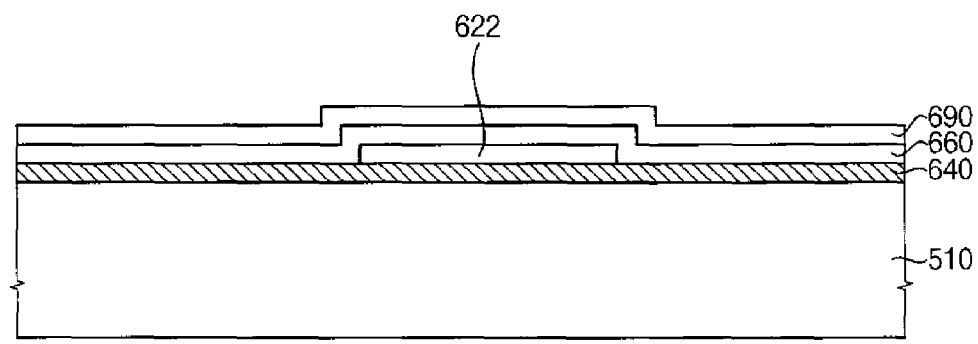

Referring to FIG. 23, a gate insulation layer 660 and a gate metal layer 690 are formed on the semiconductor pattern 622 and the light-blocking layer 640.

Figure 24:
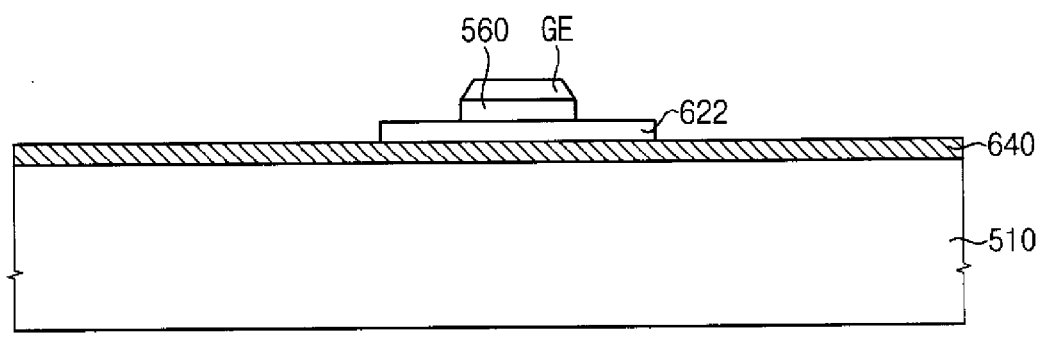

Referring to FIG. 24, the gate metal layer 690 and the gate insulation layer 660 are patterned to form a gate electrode GE, a gate line GL and a gate insulation pattern 560. Particularly, the gate metal layer 690 is patterned to form the gate electrode GE and the gate line GL. Thereafter, the gate insulation layer 660 is pattered by using the gate electrode GE and the gate line GL as a mask to form the gate insulation pattern 560. Accordingly, the light-blocking layer 640 disposed under the gate insulation layer 660 is exposed by forming the gate electrode GE, the gate line GL and the gate insulation pattern 560.

Figure 25:
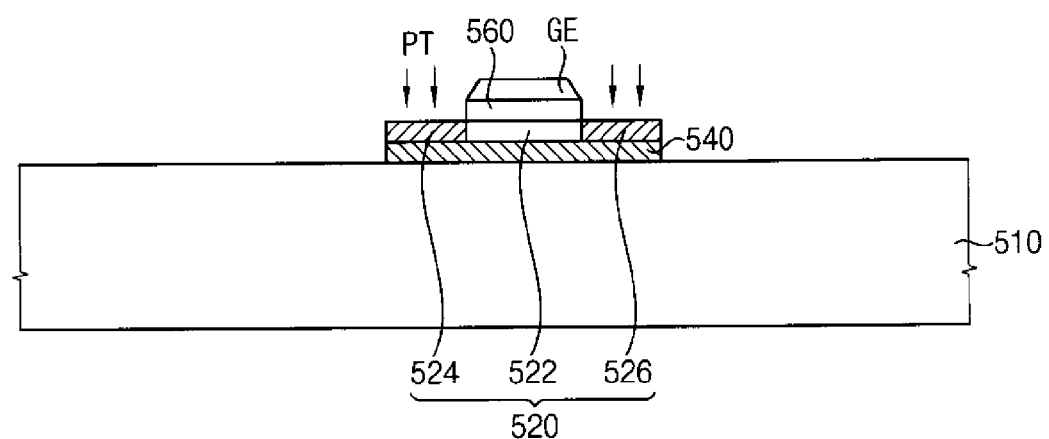

Referring to FIG. 25, the light-blocking layer 640 is etched by using the gate electrode GE and the semiconductor pattern 622 as a mask to form a light-blocking pattern 540. Thus, the light-blocking pattern 540 overlaps substantially an entire of the gate electrode GE and substantially an entire of the semiconductor pattern 622. Particularly, the light-blocking pattern 540 may have a shape substantially the same as the exemplary embodiment of the light-blocking pattern illustrated in FIG. 10.

A channel 522, a source electrode 524 and a drain electrode 526 are formed from the semiconductor pattern 622. In one exemplary embodiment, for example, a plasma gas PT or the like is provided to a portion of the semiconductor pattern 622 which is exposed by the gate electrode GE and the gate insulation pattern 560, to change the portion of the semiconductor pattern 622 to the source electrode 524 and the drain electrode 526. A portion of the semiconductor pattern 622 which is covered by the gate electrode GE and the gate insulation pattern 560, forms the channel 522.

The process of providing a plasma gas PT to the semiconductor pattern 622 may be performed after or before the light-blocking layer 640 is patterned.

Figure 26:
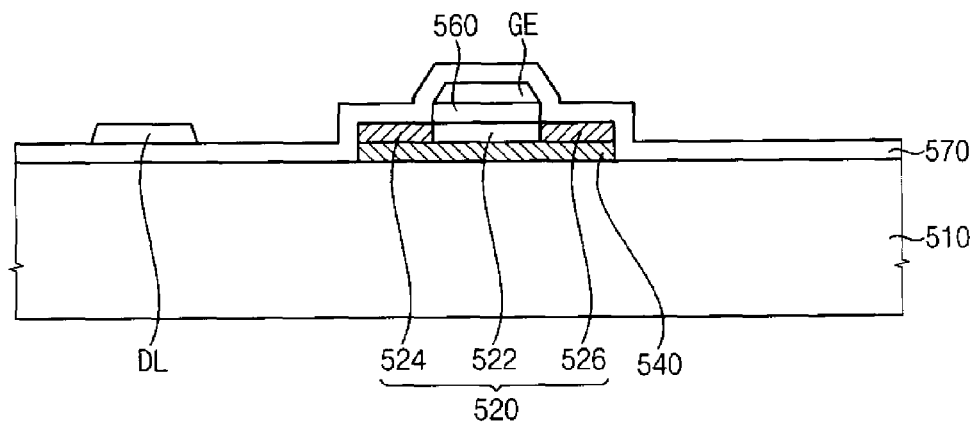

Referring to FIG. 26, a passivation layer 570 is formed to cover the gate electrode GE, the source electrode 524, the drain electrode 526 and the base substrate 510. A data metal layer is formed on the passivation layer 570, and patterned to form a data line DL.

Thereafter, with reference to FIG. 20, an organic insulation layer 580 is formed to cover the data line DL and the passivation layer 570. The passivation layer 570 and the organic insulation layer 580 are patterned to form contact holes CH1 CH2 and CH3. In an exemplary embodiment, the organic insulation layer 380 is formed directly on the data line DL, but is not limited thereto or thereby. Alternatively, after a data insulation layer including silicon oxide, silicon nitride or the like is formed to cover the data line DL, the organic insulation layer 580 may be formed on the data insulation layer.

Thereafter, a transparent conductive layer is formed on the organic insulation layer, 580 and patterned to form the connection electrode 530 and the pixel electrode PE illustrated in FIG. 20.

Figure 27:
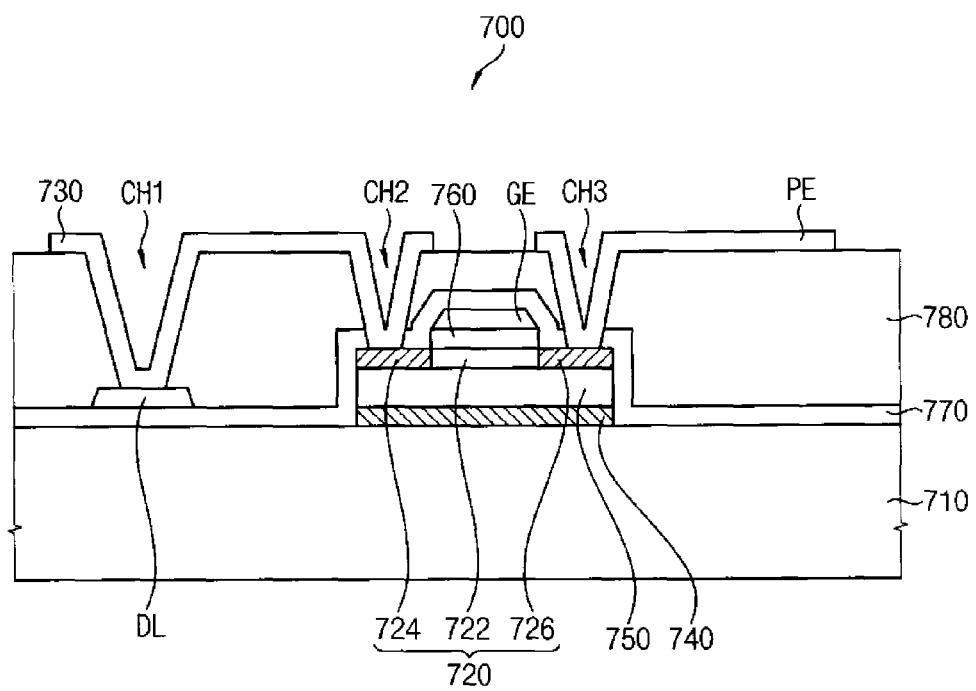
FIG. 27 is a cross-sectional view illustrating yet another exemplary embodiment of a thin film transistor substrate according to the invention.

FIG. 27 is a cross-sectional view illustrating yet another exemplary embodiment of a thin film transistor substrate according to the invention. Particularly, FIG. 27 illustrates a cross-sectional view substantially the same as that of FIG. 2, such as along line I-I' of FIG. 2.

Referring to FIG. 27, a thin film transistor substrate 700 includes a base substrate 710, a gate line GL, a data line DL, an active pattern 720, a buffer pattern 750 and a light-blocking pattern 740.

The active pattern 720 includes a channel 722, a source electrode 724 and a drain electrode 726. The channel 722, the source electrode 724 and the drain electrode 726 are formed from a same layer to be continuously disposed in a same layer of the thin film transistor substrate 700. The channel 722 is disposed between the source electrode 724 and the drain electrode 726. The drain electrode 726 is electrically connected to the pixel electrode PE. A gate insulation pattern 760 is disposed between the gate electrode GE and the channel 722.

A passivation layer 770 covers the gate electrode GE, the active pattern 720 and the base substrate 710, and an organic insulation layer 780 covers the passivation layer 770. The pixel electrode PE and a connection electrode 730 are formed on the organic insulation layer 780. The connection electrode 730 is connected to the data line DL through a first contact hole CH1, and connected to the source electrode 724 through a second contact hole CH2. The pixel electrode PE is connected to the drain electrode 726 through a third contact hole CH3.

The data line DL is formed on the passivation layer 770, and is electrically connected to the source electrode 724 via the connection electrode 730.

The light-blocking pattern 740 is disposed under the channel 722. The light-blocking pattern 740 overlaps an entire of the active pattern 720 including the channel 722, and a portion of the gate electrode GE which is exposed by the active pattern 720. Thus, the light-blocking pattern 740 has a size greater than the active pattern 720 in a plan view.

The buffer pattern 750 is disposed between the light-blocking pattern 740 and the active pattern 720. The buffer pattern 750 may have a shape substantially the same as the light-blocking pattern 740.

In the illustrated exemplary embodiment, the thin film transistor substrate 700 does not include the data insulation layer 115 illustrated in FIG. 2. Thus, the light-blocking pattern 740 may contact the base substrate 710.

The thin film transistor substrate 700 is substantially the same as the thin film transistor substrate 100 illustrated in FIGS. 1 and 2 except for excluding the data insulation layer 115, and except for the data line DL on the base substrate 110. Thus, any duplicated explanation will be omitted.

FIGS. 28 to 33 are cross-sectional views illustrating an exemplary embodiment of a method of manufacturing the thin film transistor substrate illustrated in FIG. 27.

Figure 28:
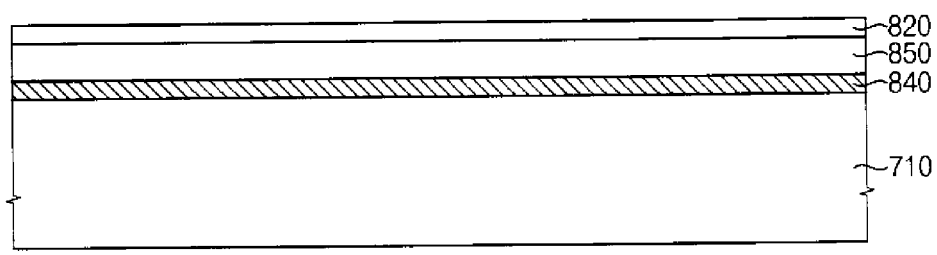
FIGS. 28 to 33 are cross-sectional views illustrating an exemplary embodiment of a method of manufacturing the thin film transistor substrate illustrated of FIG. 27.

Referring to FIG. 28, a light-blocking layer 840, a buffer layer 850, and a semiconductor layer 820 are sequentially formed on the base substrate 710.

Figure 29:
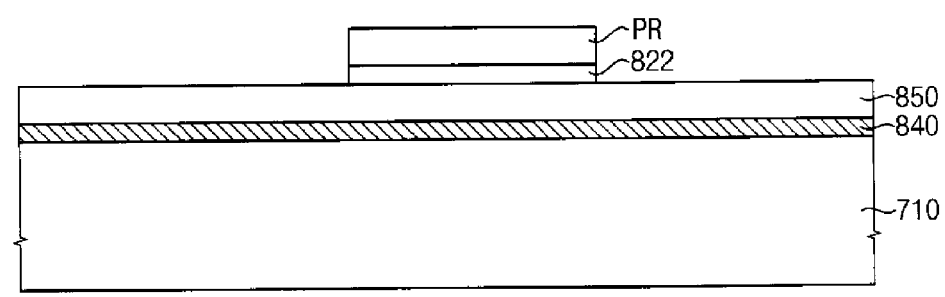

Referring to FIG. 29, the semiconductor layer 820 is patterned to form a semiconductor pattern 822. In one exemplary embodiment, for example, a photoresist pattern PR is formed on the semiconductor layer 820, and the semiconductor layer 820 is etched by using the photoresist pattern PR as a mask.

Figure 30:
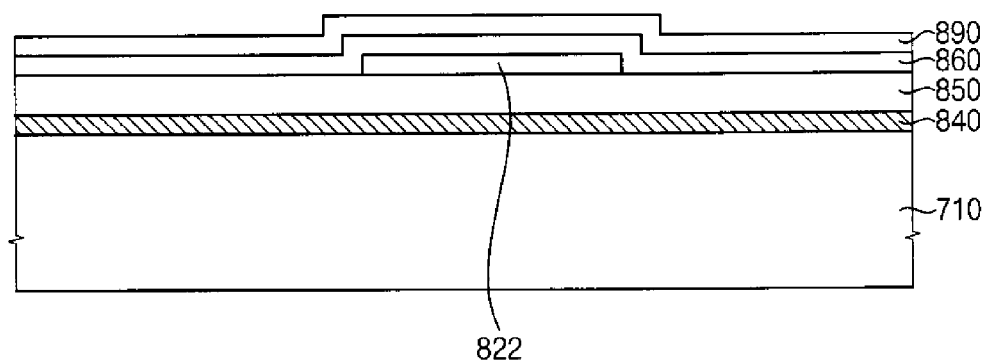

Referring to FIG. 30, a gate insulation layer 860 and a gate metal layer 890 are formed on the semiconductor pattern 822 and the buffer layer 850.

Figure 31:
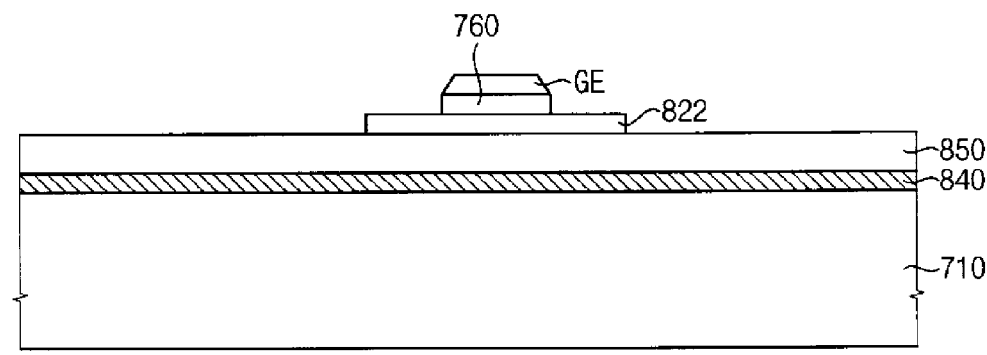

Referring to FIG. 31, the gate metal layer 890 and the gate insulation layer 860 are patterned to form a gate electrode GE, a gate line GL and a gate insulation pattern 760. Particularly, the gate metal layer 890 is patterned to form the gate electrode GE and the gate line GL. Thereafter, the gate insulation layer 860 is pattered by using the gate electrode GE and the gate line GL as a mask to form the gate insulation pattern 760. Accordingly, the buffer layer 850 disposed under the gate insulation layer 860 is exposed by forming the gate electrode GE, the gate line GL and the gate insulation pattern 760.

Figure 32:
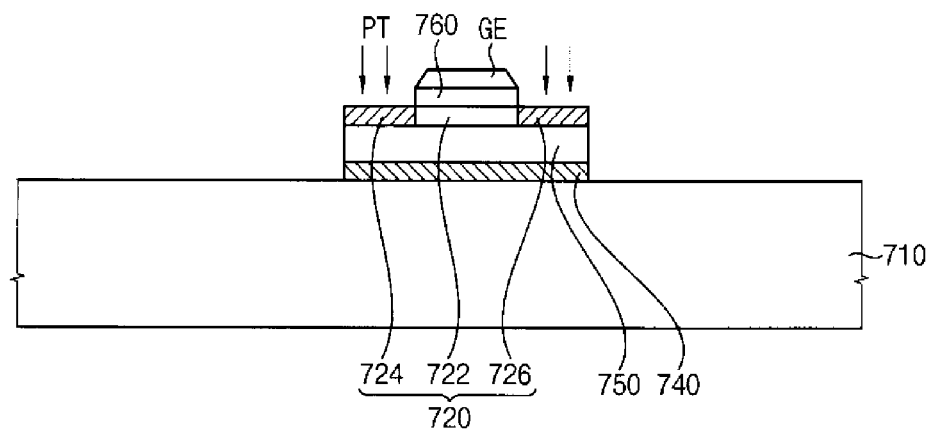

Referring to FIG. 32, the buffer layer 850 and the light-blocking layer 840 are etched by using the gate electrode GE and the semiconductor pattern 822 as a mask to form a buffer pattern 750 and a light-blocking pattern 740. Thus, each of the buffer pattern 750 and the light-blocking pattern 740 overlaps substantially an entire of the gate electrode GE and substantially an entire of the semiconductor pattern 822. Particularly, the light-blocking pattern 740 may have a shape substantially the same as the exemplary embodiment of the light-blocking pattern illustrated in FIG. 10.

A channel 722, a source electrode 724 and a drain electrode 726 are formed from the semiconductor pattern 822. In one exemplary embodiment, for example, a plasma gas PT or the like is provided to a portion of the semiconductor pattern 822 which is exposed by the gate electrode GE and the gate insulation pattern 760, to change the portion of the semiconductor pattern 822 to the source electrode 724 and the drain electrode 726. A portion of the semiconductor pattern 822 which is covered by the gate electrode GE and the gate insulation pattern 760, forms the channel 722.

The process of providing a plasma gas to the semiconductor pattern 822 may be performed after or before the light-blocking layer 840 is patterned.

Figure 33:
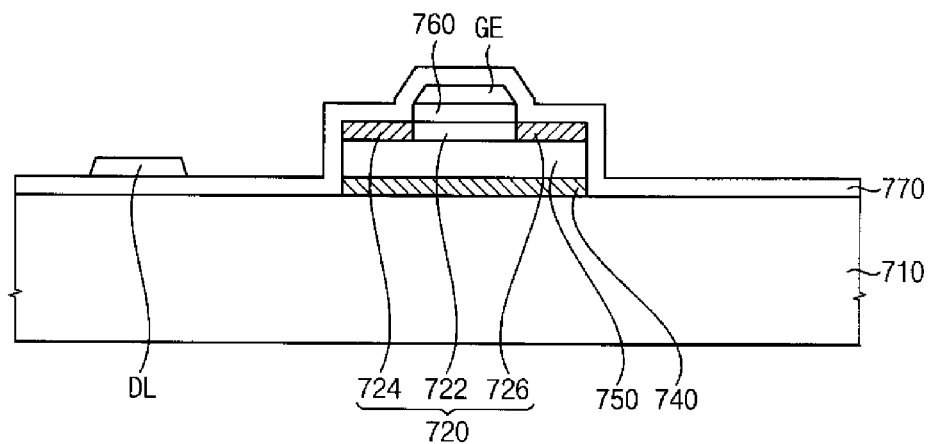

Referring to FIG. 33, a passivation layer 770 is formed to cover the gate electrode GE, the source electrode 724, the drain electrode 726 and the base substrate 710. A data metal layer is formed on the passivation layer 770, and patterned to form a data line DL.

Thereafter, with reference to FIG. 27, an organic insulation layer 780 is formed to cover the data line DL and the passivation layer 770. The passivation layer 770 and the organic insulation layer 780 are patterned to form contact holes CH1, CH2 and CH3.

Thereafter, a transparent conductive layer is formed on the organic insulation layer 780, and patterned to form the connection electrode 730 and the pixel electrode PE illustrated in FIG. 27.

Having described exemplary embodiments of the invention, it is further noted that it is readily apparent to those of reasonable skill in the art that various modifications may be made without departing from the spirit and scope of the invention which is defined by the metes and bounds of the appended claims.

What is claimed is:

1. A method of manufacturing a thin film transistor substrate, the method comprising:
   providing a light-blocking layer on a base substrate;
   providing a semiconductor layer on the light-blocking layer;
   patterning the semiconductor layer to form a semiconductor pattern;
   sequentially providing a gate insulation layer and a gate metal layer on the semiconductor pattern;
   patterning the gate metal layer to form a gate electrode;
   patterning the gate insulation layer to form a gate insulation pattern; and
   patterning the light-blocking layer by using the gate electrode and the semiconductor pattern as a mask, to form a light-blocking pattern having a planar size greater than a planar size of the semiconductor pattern.

2. The method of claim 1, wherein the forming the gate insulation pattern exposes portions of the semiconductor pattern;
   further comprising providing a plasma to the exposed portions of the semiconductor pattern to form a source electrode and a drain electrode.

3. The method of claim 2, further comprising:
   providing a data line on the base substrate before the providing the light-blocking layer; and
   providing a data insulation layer covering the data line.

4. The method of claim 2, further comprising:
   providing a buffer layer on the light-blocking layer, before the providing the semiconductor layer.

* * * * *